US011145643B2

(12) United States Patent
Hiura (10) Patent No.: US 11,145,643 B2
(45) Date of Patent: Oct. 12, 2021

(54) SEMICONDUCTOR DEVICE, METHOD FOR MANUFACTURING SEMICONDUCTOR DEVICE, AND PID PROTECTION DEVICE (71) Applicant: SONY SEMICONDUCTOR SOLUTIONS CORPORATION, Kanagawa (JP)

(72) Inventor: Yohei Hiura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 10 days.

(21) Appl. No.: 16/330,937

(22) PCT Filed: Sep. 28, 2017

(86) PCT No.: PCT/JP2017/035191
§ 371 (c)(1),
(2) Date: Mar. 6, 2019

(87) PCT Pub. No.: WO2018/070260
PCT Pub. Date: Apr. 19, 2018

(65) Prior Publication Data
US 2019/0237459 A1 Aug. 1, 2019

(30) Foreign Application Priority Data
Oct. 12, 2016 (JP) .............................. JP2016-200643

(51) Int. Cl.
*H01L 27/02* (2006.01)
*H01L 29/78* (2006.01)
(Continued)

(52) U.S. Cl.
CPC ...... *H01L 27/0292* (2013.01); *H01L 21/3205* (2013.01); *H01L 21/768* (2013.01);
(Continued)

(58) Field of Classification Search
CPC ............. H01L 27/0266; H01L 27/0255; H01L 27/0259; H01L 27/0292
See application file for complete search history.

(56) References Cited

U.S. PATENT DOCUMENTS 5,959,309 A * 9/1999 Tsui ........................ H01L 22/34
257/48
5,966,024 A * 10/1999 Bui ....................... B24B 37/013
257/E21.528
(Continued)

FOREIGN PATENT DOCUMENTS

CN 1351378 A 5/2002
CN 1845331 A 10/2006
(Continued)

OTHER PUBLICATIONS

International Search Report and Written Opinion of PCT Application No. PCT/JP2017/035191, dated Dec. 19, 2017, 11 pages of ISRWO.

*Primary Examiner* — Shahed Ahmed
*Assistant Examiner* — Khatib A Rahman
(74) *Attorney, Agent, or Firm* — Chip Law Group (57) ABSTRACT

The present disclosure relates to a semiconductor device, a method for manufacturing a semiconductor device, and a plasma-induced damage (PID) protection device capable of, without increasing a chip area, releasing a large PID with high efficiency and protecting an element to be protected from the PID with higher accuracy. There are provided a protection metal-oxide-semiconductor field-effect transistor (MOSFET) that includes a drain connected to a gate electrode of a MOSFET to be protected and a grounded source and protects the MOSFET to be protected from a plasma-induced damage (PID), and a dummy antenna connected to a gate electrode of the protection MOSFET, the dummy antenna turning on the protection MOSFET prior to the (Continued)

MOSFET to be protected due to PID charge. The present disclosure can be applied to a semiconductor device.

11 Claims, 7 Drawing Sheets

(51) Int. Cl.
 H01L 21/8234 (2006.01)
 H01L 21/768 (2006.01)
 H01L 23/522 (2006.01)
 H01L 21/3205 (2006.01)
(52) U.S. Cl.
 CPC .... *H01L 21/823475* (2013.01); *H01L 23/522* (2013.01); *H01L 27/0255* (2013.01); *H01L 27/0259* (2013.01); *H01L 27/0266* (2013.01); *H01L 27/0288* (2013.01); *H01L 29/78* (2013.01)

(56) References Cited

U.S. PATENT DOCUMENTS

| | | | |
|---|---|---|---|
| 6,218,705 B1* | 4/2001 | Noguchi | H01L 27/0266 257/355 |
| 6,414,358 B1* | 7/2002 | Lin | H01L 27/0255 257/356 |
| 6,713,817 B2 | 3/2004 | Kitagawa et al. | |
| 7,317,633 B2* | 1/2008 | Lusky | H01L 27/0266 257/324 |
| 8,445,966 B2* | 5/2013 | Rogers | H01L 29/66477 257/355 |
| 8,890,164 B1* | 11/2014 | Pan | H01L 21/823892 257/69 |
| 2001/0026970 A1 | 10/2001 | Eitan et al. | |
| 2001/0053054 A1* | 12/2001 | Andoh | H01L 27/0288 361/56 |
| 2002/0063298 A1* | 5/2002 | Wang | H01L 27/0266 257/379 |
| 2003/0068878 A1* | 4/2003 | Lin | H01L 27/0251 438/618 |
| 2003/0075762 A1* | 4/2003 | Lin | H01L 23/52 257/355 |
| 2005/0040466 A1* | 2/2005 | Arai | H01L 27/0266 257/362 |
| 2006/0226485 A1* | 10/2006 | Arakawa | H01L 27/0251 257/347 |
| 2008/0105925 A1* | 5/2008 | Pae | H01L 27/1207 257/347 |
| 2009/0224326 A1* | 9/2009 | Tan | H01L 21/823857 257/360 |
| 2010/0216300 A1* | 8/2010 | Ueda | H01L 21/02164 438/585 |
| 2010/0254050 A1* | 10/2010 | Tang | H01L 27/0207 361/56 |
| 2017/0336467 A1* | 11/2017 | Mikalo | H01L 23/528 |
| 2018/0096987 A1* | 4/2018 | Bill | H01L 22/34 |
| 2019/0164952 A1* | 5/2019 | Chang | H01L 27/0886 |
| 2020/0203335 A1* | 6/2020 | Park | H01L 27/0266 |

FOREIGN PATENT DOCUMENTS

| | | |
|---|---|---|
| EP | 1061580 A2 | 12/2000 |
| JP | 10-335098 A | 12/1998 |
| JP | 11-345885 A | 12/1999 |
| JP | 2001-057389 A | 2/2001 |
| JP | 2002-141421 A | 5/2002 |
| JP | 2006-294719 A | 10/2006 |
| KR | 10-2002-0034909 A | 5/2002 |
| KR | 10-2006-0107280 A | 10/2006 |
| TW | 221337 B | 9/2004 |

* cited by examiner

PRIOR ART

FIG. 1

PRIOR ART

SEMICONDUCTOR DEVICE, METHOD FOR MANUFACTURING SEMICONDUCTOR DEVICE, AND PID PROTECTION DEVICE

CROSS REFERENCE TO RELATED APPLICATIONS

This application is a U.S. National Phase of International Patent Application No. PCT/JP2017/035191 filed on Sep. 28, 2017, which claims priority benefit of Japanese Patent Application No. JP 2016-200643 filed in the Japan Patent Office on Oct. 12, 2016. Each of the above-referenced applications is hereby incorporated herein by reference in its entirety.

TECHNICAL FIELD

The present disclosure relates to a semiconductor device, a method for manufacturing a semiconductor device, and a plasma-induced damage (PID) protection device. More particularly, the present disclosure relates to a semiconductor device, a method for manufacturing a semiconductor device, and a PID protection device capable of, without increasing a chip area, releasing a large PID with high efficiency and protecting an element to be protected from the PID.

BACKGROUND ART

A threshold value Vth of a metal-oxide-semiconductor field-effect transistor (MOSFET) fluctuates due to wiring of a semiconductor device and a damage induced by a plasma process (plasma-induced damage (PID)) used for forming a via, which may result in a reduction in yield and malfunction of a semiconductor product.

The PID is generated in such a manner that the wiring and the via mainly connected to a gate of the MOSFET act as an antenna and collect charge during the plasma process, and the charge flows into a gate insulating film.

In order to avoid the influence of the PID, it is necessary to apply a protection element that functions to release the charge to a substrate or the like before the charge flows into the MOSFET.

In view of the above, there has been proposed a structure in which a diode as a protection element is added to a gate electrode of an nMOSFET (n-channel MOSFET) to be an element to be protected, to which the wiring and the via acting as an antenna are connected, and a PID charge introduced from the antenna is released to the substrate as a forward current or a reverse leakage current of the added diode to suppress characteristic variation caused by the PID to the nMOSFET.

Furthermore, there has also been proposed a method in which a MOSFET with an antenna added to the gate instead of the diode is provided as a protection element, the MOSFET as the protection element is turned on by the charge caused by the PID, and the element to be protected is protected by an ON current of the MOSFET (see Patent Document 1).

In the example disclosed in Patent Document 1, ON resistance of the MOSFET as the protection element is significantly smaller than resistance of a reverse diode as the protection element described above, whereby a higher protection capability can be achieved.

CITATION LIST

Patent Document

Patent Document 1: Japanese Patent Application Laid-Open No. 2001-057389

SUMMARY OF THE INVENTION

Problems to be Solved by the Invention

However, according to the structure disclosed in Patent Document 1, a gate electrode of the MOSFET as the protection element is in a floating state after the manufacturing process so that the protection MOSFET is not necessarily turned off due to residual charges or the like. Accordingly, there has been a possibility that gate leakage of the element to be protected, malfunction of a chip, and power consumption are increased.

The present disclosure has been conceived in view of such circumstances, and an object of the present disclosure is to release a large plasma-induced damage (PID) charge highly efficiently without increasing a chip area, and to protect an element to be protected from the PID with higher accuracy.

Solutions to Problems

A semiconductor device according to a first aspect of the present disclosure includes a protection metal-oxide-semiconductor field-effect transistor (MOSFET) that includes a drain connected to a gate electrode of a MOSFET to be protected and a grounded source and protects the MOSFET to be protected from a plasma-induced damage (PID), and a dummy antenna connected to a gate electrode of the protection MOSFET, the dummy antenna turning on the protection MOSFET before charge accumulates in the gate electrode of the MOSFET to be protected due to PID charge.

A via included in the dummy antenna can be a via having a smaller diameter than that of the via connected to the MOSFET to be protected.

Wiring included in the dummy antenna can be wiring having a pitch smaller than that of the wiring connected to the MOSFET to be protected.

In a case where the PID charge is not generated, a potential switching unit in which the potential of the gate electrode of the protection MOSFET becomes ground potential may be further included.

The potential switching unit may be a diode provided between the gate electrode and a substrate in which a forward direction is directed to the substrate.

The potential switching unit may be a resistor provided between the gate electrode and the substrate.

The potential switching unit may be a MOSFET provided between the gate electrode and the substrate.

A method for manufacturing a semiconductor device according to the first aspect of the present disclosure, the semiconductor device including: a protection metal-oxide-semiconductor field-effect transistor (MOSFET) that includes a drain connected to a gate electrode of a MOSFET to be protected and a grounded source and protects the MOSFET to be protected from a plasma-induced damage (PID); and a dummy antenna connected to a gate electrode of the protection MOSFET, the dummy antenna turning on the protection MOSFET before charge accumulates in the gate electrode of the MOSFET to be protected due to PID charge, the method including: a step of forming the MOSFET to be protected; a step of forming the protection MOSFET; a step of forming wiring between the gate electrode of the MOSFET to be protected and the drain of the protection MOSFET; a step of forming wiring and a via in the MOSFET to be protected; and a step of forming the dummy antenna on the protection MOSFET.

A step of forming a gate protective diode may be further included.

A plasma-induced damage (PID) protection device according to the first aspect of the present disclosure includes a protection metal-oxide-semiconductor field-effect transistor (MOSFET) that includes a drain connected to a gate electrode of a MOSFET to be protected and a grounded source and protects the MOSFET to be protected from a PID, and a dummy antenna connected to a gate electrode of the protection MOSFET, the dummy antenna turning on the protection MOSFET before charge accumulates in the gate electrode of the MOSFET to be protected due to PID charge.

A potential switching unit, which functions as a resistor when current flows from the gate electrode of the MOSFET to be protected to a substrate through a channel of the protection MOSFET, and becomes a ground potential when the current does not flow, may be further included.

The potential switching unit may be a diode provided between the gate electrode and a substrate in which a forward direction is directed to the substrate.

The potential switching unit may be a resistor provided between the gate electrode and the substrate.

The potential switching unit may be a MOSFET provided between the gate electrode and the substrate.

According to the first aspect of the present disclosure, by the protection metal-oxide-semiconductor field-effect transistor (MOSFET) that includes the drain connected to the gate electrode of the MOSFET to be protected and the grounded source, the MOSFET to be protected is protected from the plasma-induced damage (PID), and by the dummy antenna connected to the gate electrode of the protection MOSFET, the protection MOSFET is turned on before charge accumulates in the gate electrode of the MOSFET to be protected due to the PID charge.

A plasma-induced damage (PID) protection device according to a second aspect of the present disclosure includes a bipolar transistor that includes a collector connected to a gate electrode of a metal-oxide-semiconductor field-effect transistor (MOSFET) to be protected and a grounded emitter and protects the MOSFET to be protected from a PID, and a dummy antenna connected to a base electrode of the bipolar transistor, the dummy antenna turning on the bipolar transistor before charge accumulates in the gate electrode of the MOSFET to be protected due to PID charge.

A potential switching unit, which functions as a resistor when current flows from the gate electrode of the MOSFET to be protected to a substrate through a channel of the protection MOSFET, and becomes a ground potential when the current does not flow, may be further included.

The potential switching unit may be a diode provided between the base electrode and the emitter in which a forward direction is directed to the emitter.

The potential switching unit may be a resistor provided between the base electrode and the emitter.

The potential switching unit may be a MOSFET provided between the base electrode and the emitter.

According to the second aspect of the present disclosure, by the bipolar transistor that includes the collector connected to the gate electrode of the metal-oxide-semiconductor field-effect transistor (MOSFET) to be protected and the grounded emitter, the MOSFET to be protected is protected from the plasma-induced damage (PID), and by the dummy antenna connected to the base electrode of the bipolar transistor, the transistor is turned on before charge accumulates in the gate electrode of the MOSFET to be protected due to the PID charge.

Effects of the Invention

According to the first and second aspects of the present disclosure, a large plasma-induced damage (PID) charge is released highly efficiently without increasing the chip area, whereby the element to be protected can be protected from the PID with higher accuracy.

MODE FOR CARRYING OUT THE INVENTION

Hereinafter, preferred embodiments of the present disclosure will be described in detail with reference to the accompanying drawings. Note that, in the present specification and the drawings, constituent elements having substantially the same functional configuration will be denoted by the same reference signs, and duplicate descriptions thereof will be omitted.

<Exemplary Configuration of Conventional Semiconductor Device>

A semiconductor device to which the technique of the present disclosure is applied releases a large plasma-induced damage (PID) charge highly efficiently without increasing a chip area to protect an element to be protected from the PID. As a description of the semiconductor device, first, a conventional semiconductor device that protects the element to be protected from the PID will be described.

A threshold value Vth of a metal-oxide-semiconductor field-effect transistor (MOSFET) fluctuates due to wiring of the semiconductor device and a damage induced by a plasma process (plasma-induced damage (PID)) used for forming a via (through hole), whereby a yield rate decreases. The PID is generated in such a manner that the wiring and the via mainly connected to a gate of the MOSFET act as an antenna and collect charge during the plasma process, and the charge flows into a gate insulating film. In order to avoid the influence of the PID, it is necessary to provide a protection element that functions to release the charge to a substrate or the like before the charge flows into the MOSFET.

Figure 1:
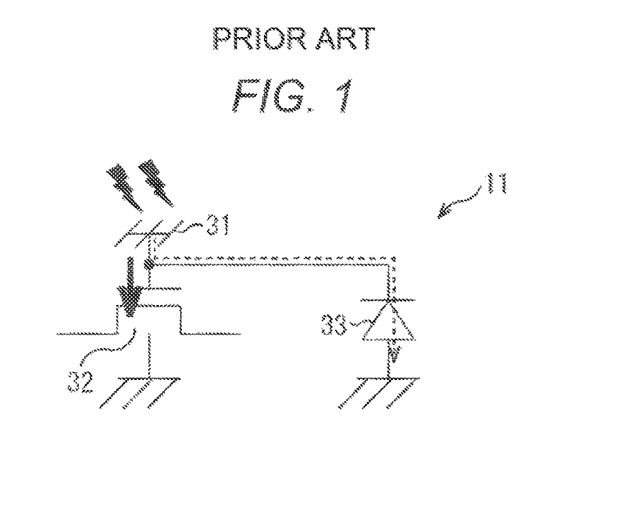
FIG. 1 is a diagram illustrating an exemplary configuration of a conventional semiconductor device configured to be protected from a PID.

In view of the above, as illustrated in FIG. 1, a device using a diode as a protection element for the element to be protected of an nMOSFET (n-channel MOSFET) has been proposed.

That is, a semiconductor device 11 in FIG. 1 has a structure in which a diode 33 is added to the wiring that functions as an antenna 31 and a gate electrode of an nMOSFET 32 to which the via is connected.

In the structure in FIG. 1, as indicated by the dotted arrow, a PID charge introduced from the antenna 31 is released to the substrate as a reverse leakage current or a forward current of the added diode, thereby suppressing characteristic variation caused by the PID to the nMOSFET 32. The diode 33 is biased in the forward direction in a case where the PID charge is negative charge, and is biased in the reverse direction in a case where the PID charge is positive charge.

The positive and negative of the PID charge that affects the characteristic of the MOSFET 32 varies depending on conditions of a forming process of the wiring and the via, for example. For example, in order to suppress the influence of a positive charge injection based on electron shading that becomes noticeable due to pattern miniaturization and an increase in aspect ratio, in this example, it is necessary to use the protective diode 33 in which a certain reverse current flows.

Incidentally, while the necessary reverse current is dependent on the process of forming the wiring and the via, in the process of forming an Si substrate through via used in a device in which a plurality of semiconductor chips are laminated in recent years and a chip size package (CSP), the influence of the PID tends to be larger. Accordingly, in order to suppress the influence of the PID in recent years using the protective diode 33 as illustrated in FIG. 1, the area needs to be enlarged to increase the current to be released. However, there is a possibility that the increase in the area results in an increase in device configuration.

In view of the above, in Patent Document 1 mentioned above, there is also proposed a method in which a protection MOSFET with an antenna added to a gate instead of the protective diode 32 is provided, the protection MOSFET is turned on by charge caused by the PID, and an element to be protected is protected by the ON current of the protection MOSFET.

Figure 2:
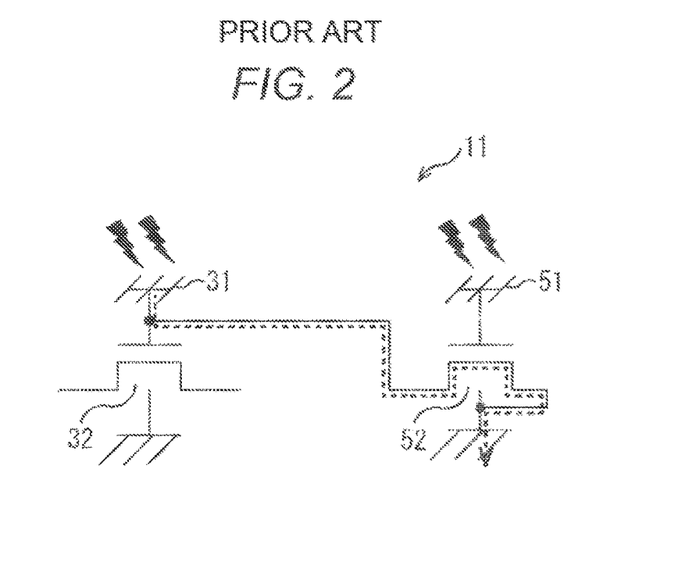
FIG. 2 is a diagram illustrating another exemplary configuration of the conventional semiconductor device configured to be protected from the PID.

In other words, as illustrated in FIG. 2, in the semiconductor device 11 disclosed in Patent Document 1, an antenna 51 and a MOSFET 52 are provided instead of the diode 32 in the semiconductor device 11 in FIG. 1.

According to such a configuration, the charge caused by the PID flows into the gate of the MOSFET 52 via the antenna 51, whereby the protection MOSFET 52 is turned on. As a result, as indicated by the dotted arrow in FIG. 2, the protection MOSFET 52 releases the charge in the plasma process introduced from the antenna 31 to the substrate using an ON current, thereby protecting the MOSFET to be protected 32 that is the element to be protected.

In this example, ON resistance of the MOSFET 52 is significantly smaller than that in the case of the reverse diode 33 as illustrated in FIG. 1, whereby the protection capability higher than that in the case of the diode 33 can be achieved.

However, with this structure, a gate electrode of the protection MOSFET 52 is in a floating state after the manufacturing process so that the protection MOSFET is not necessarily turned off due to residual charges or the like. Accordingly, there is a possibility that gate leakage of the element to be protected increases, and malfunction of the chip and an increase in power consumption are caused.

The PID is a damage caused by the charge injected from the plasma into a gate oxide film of the MOSFET during the plasma process, which causes the characteristic variation of the MOSFET, and a reduction in yield and malfunction of a semiconductor product.

<Mechanism of Characteristic Variation Based on PID>

Next, with reference to FIG. 3, an outline of a mechanism of a through silicon via (TSV) process of the PID in a chip size package (CSP) structure will be described as an example.

Figure 3:
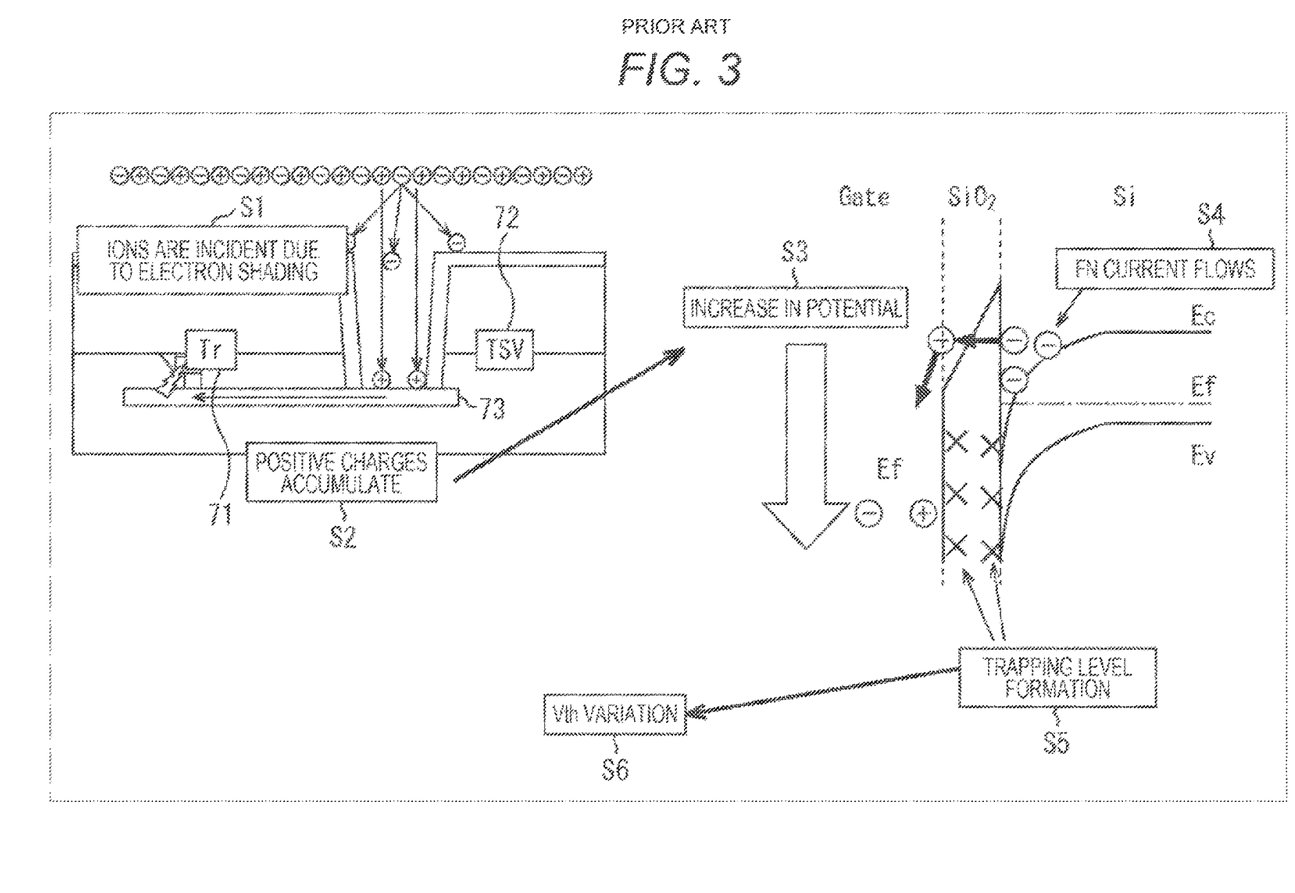
FIG. 3 is a diagram illustrating an outline of a mechanism of the PID.

In a case where a TSV 72 is opened in the plasma process, as illustrated in the left part of FIG. 3, ions are made incident due to the electron shading effect when the aspect ratio of the TSV 72 is large in a first step (S1).

Then, in a second step (S2), charges reaching the bottom of the TSV accumulate ions having positive charges.

In a third step (S3), the charges increase (decrease) potential of a gate electrode of a MOSFET 71 via wiring 73 under the TSV 72, thereby generating a large electric field in the gate insulating film.

In a fourth step (S4), when accumulation of the charges in the gate electrode becomes equal to or higher than a predetermined level, Fowler Nordheim (FN) tunnel current flows in the gate oxide film.

In a fifth step (S5), a trapping order is formed in the gate oxide film and an oxide film Si interface due to the FN tunnel current.

In a sixth step (S6), a threshold value Vth of the MOSFET 71 fluctuates due to the trapping order being formed.

In the TSV process in the CSP structure, in a case where a diode (corresponding to the diode 33 in FIG. 1) is used as a protection element of the nMOSFET, a large current flows to release the PID charge having the positive charge so that the area of the diode needs to be enlarged. In some cases, it is necessary to set the protection element area of 10,000 to 100,000 times as compared with that in the case of a single-layered normal package product, which increases the chip area and a size of the device configuration.

Furthermore, in the MOSFET type protection element (corresponding to the MOSFET 52 in FIG. 2) disclosed in Patent Document 1, although the increase in area may be avoided, due to the influence of the residual charge, a gate leakage current of the element to be protected may increase, and the reduction in yield and the increase in power consumption may be caused.

<Exemplary Configuration of Semiconductor Device of Present Disclosure>

Next, an exemplary configuration of the semiconductor device according to the present disclosure will be described with reference to FIG. 4. The semiconductor device according to the present disclosure releases a large PID charge highly efficiently without increasing the chip area, thereby protecting the element to be protected from the PID.

In a semiconductor device 100 according to the present disclosure, a drain terminal of a MOSFET (protection MOSFET) 104 that functions as a protection element is connected to a terminal that receives the PID, such as a gate of a MOSFET 102 that is an element to be protected.

The PID charge flows into a gate electrode of the protection MOSFET 104 via the dummy antenna 103, and the protection MOSFET 104 is turned on. Furthermore, at least one stage of forward gate bias setting diodes 105-1 and 105-2 is added to the dummy antenna 103. According to such a structure, the PID charge flows, as current, from the dummy antenna 103 to the substrate via the gate bias setting diodes 105-1 and 105-2 so that a forward voltage drop occurs and a bias is applied to the gate of the protection MOSFET 104, whereby the protection MOSFET 104 is turned on.

Figure 4:
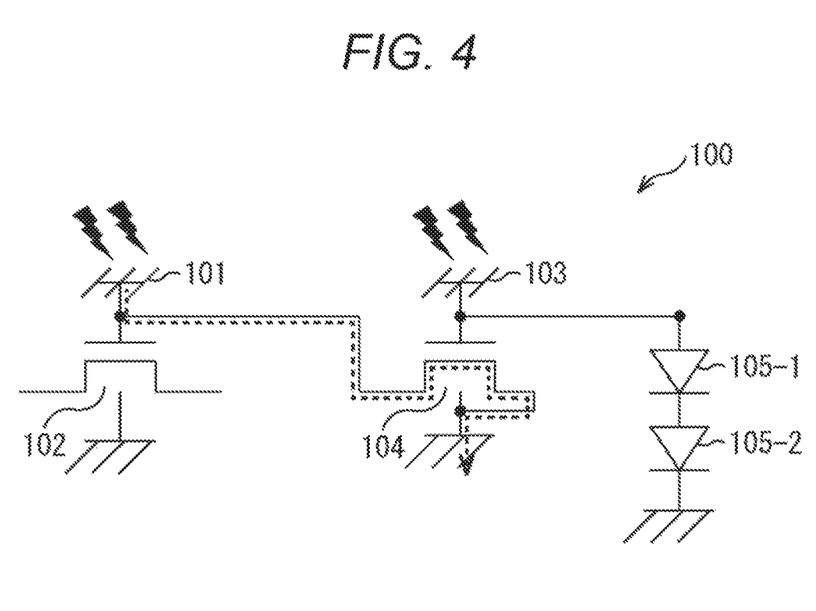
FIG. 4 is a diagram illustrating an exemplary configuration of a semiconductor device according to the present disclosure.

In other words, in FIG. 4, the current of the PID charge flowing through the dummy antenna 103 flows in the gate of the protection MOSFET 104 so that the protection MOSFET 104 is turned on and the PID charge is released through an antenna 101 due to the ON current, whereby the resistance is significantly reduced compared with the case using the protective diode 33 illustrated in FIG. 1.

Furthermore, in the structure of the semiconductor device 100 in FIG. 4, although the MOSFET is used as the protection element in common with the technique disclosed in Patent Document 1 described above, the gate electrode of the protection MOSFET 104 is not in the floating state, whereby an increase in leakage caused by the residual charge can be suppressed. Moreover, by adjusting the number of stages of the gate bias setting diode 105 according to the charge amount of the PID, an appropriate bias can be applied to the gate of the protection MOSFET 104, whereby it becomes possible to deal with the PID charge in various levels.

More specifically, a drain terminal of the nMOSFET used as the protection MOSFET 104 is connected to a gate electrode of the nMOSFET of the MOSFET to be protected 102. The dummy antenna 103 and the gate bias setting diodes 105-1 and 105-2 including two stages of forward diodes are connected a gate terminal of the protection MOSFET 104.

In a case where a positive plasma charge enters the gate of the protection MOSFET 104 during the plasma process, a positive plasma charge also enters the dummy antenna 103 at the same time. The current based on the charge passes through the forward diode to the low potential substrate, and the forward voltage drop of the gate bias setting diodes 105-1 and 105-2 occurs due to the current, whereby the gate of the protection MOSFET 104 is turned on. In this state, the plasma charge entering the gate of the MOSFET to be protected 102 passes through a channel of the protection MOSFET 104 in the ON state to the low-potential source grounded.

Since an escape path of the charge damaging the MOSFET to be protected 102 becomes the ON-state MOSFET channel of the protection MOSFET 104, the resistance is significantly smaller than that of the reverse diode 33 (FIG. 1), and the protection function is high. Since the gate potential of the protection MOSFET 104 is fixed low after the process is complete, there is no adverse effect such as an increase in leakage.

For example, a case where a test of applying an electrical stress to the gate is conducted using the protection MOSFET 102 with a threshold value of 0.4 V and a gate current value at which problematic threshold variation occurs is 3E-13A will be considered.

Figure 5:
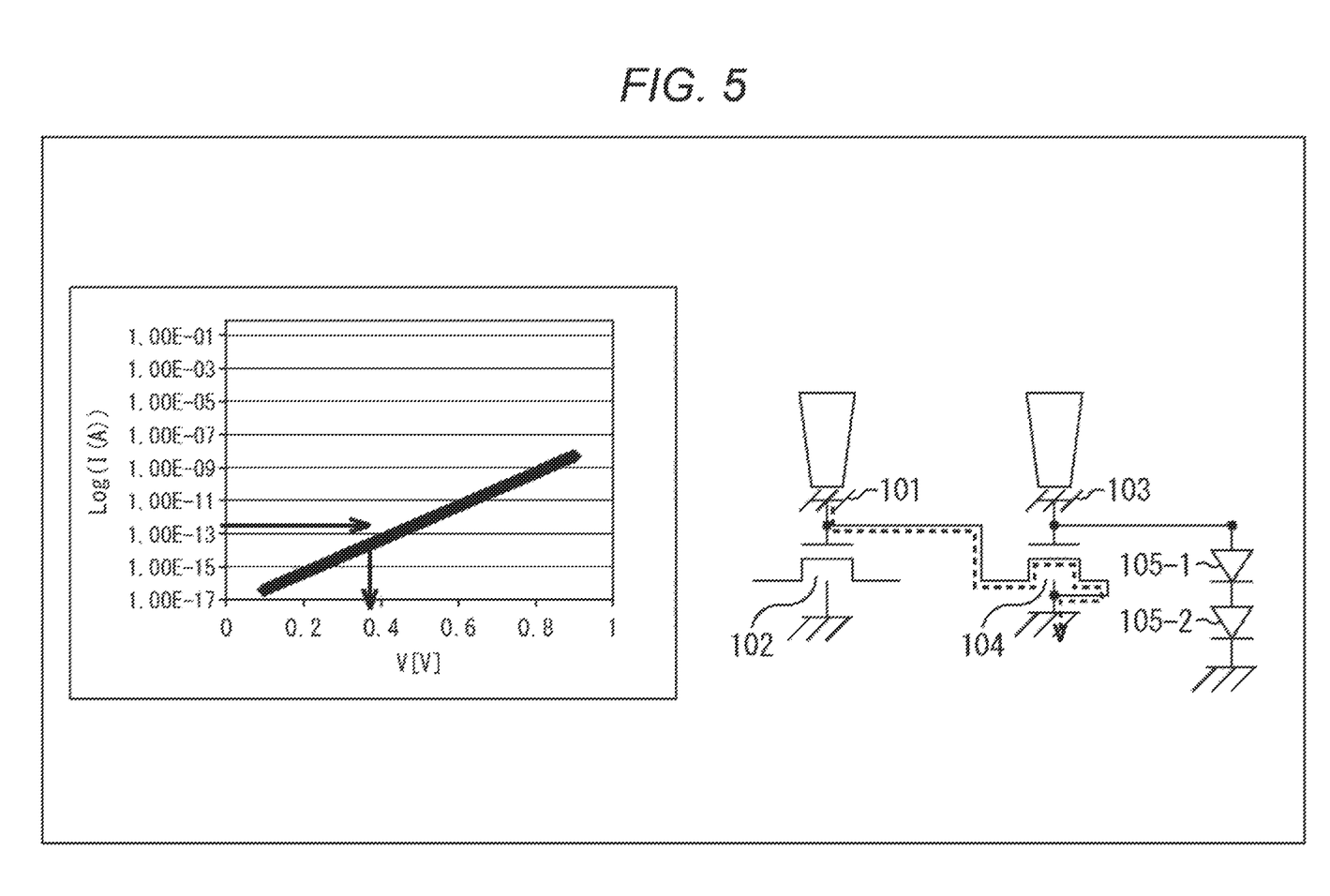
FIG. 5 is a diagram illustrating an exemplary configuration of the semiconductor device in FIG. 4 configured to be protected from the PID.

As illustrated in FIG. 5, in a case where a diode having a forward characteristic is used as the gate bias setting diode 105, the forward voltage drop per one stage of the protective diode is about 0.3 V when the current causing threshold variation flows.

Therefore, in this case, if the gate bias setting diodes 105-1 and 105-2 including two stages of the forward diodes are added, a voltage of 0.6 V, which is higher than the threshold value Vth (=0.4 V), is applied to the gate of the protection MOSFET 104, and the protection MOSFET 104 is turned on while the problematic PID stress is applied, whereby the MOSFET to be protected 102 can be reliably protected.

Note that, although the exemplary case where the gate bias setting diode 105 is the diode having the forward characteristic has been described, it is not limited to the diode having the forward characteristic as long as it functions as a resistor while the current flows and has a function of being a ground potential (potential switching function) while the current does not flow, which may be, for example, a resistor, diode-connected MOSFET, or the like.

In the present disclosure, although a layout of the dummy antenna 103 is required, the dummy antenna 103 is shared by a plurality of protection MOSFETs 104, whereby the total area can be made smaller than that in the case of using the conventional diode 33.

Figure 6:
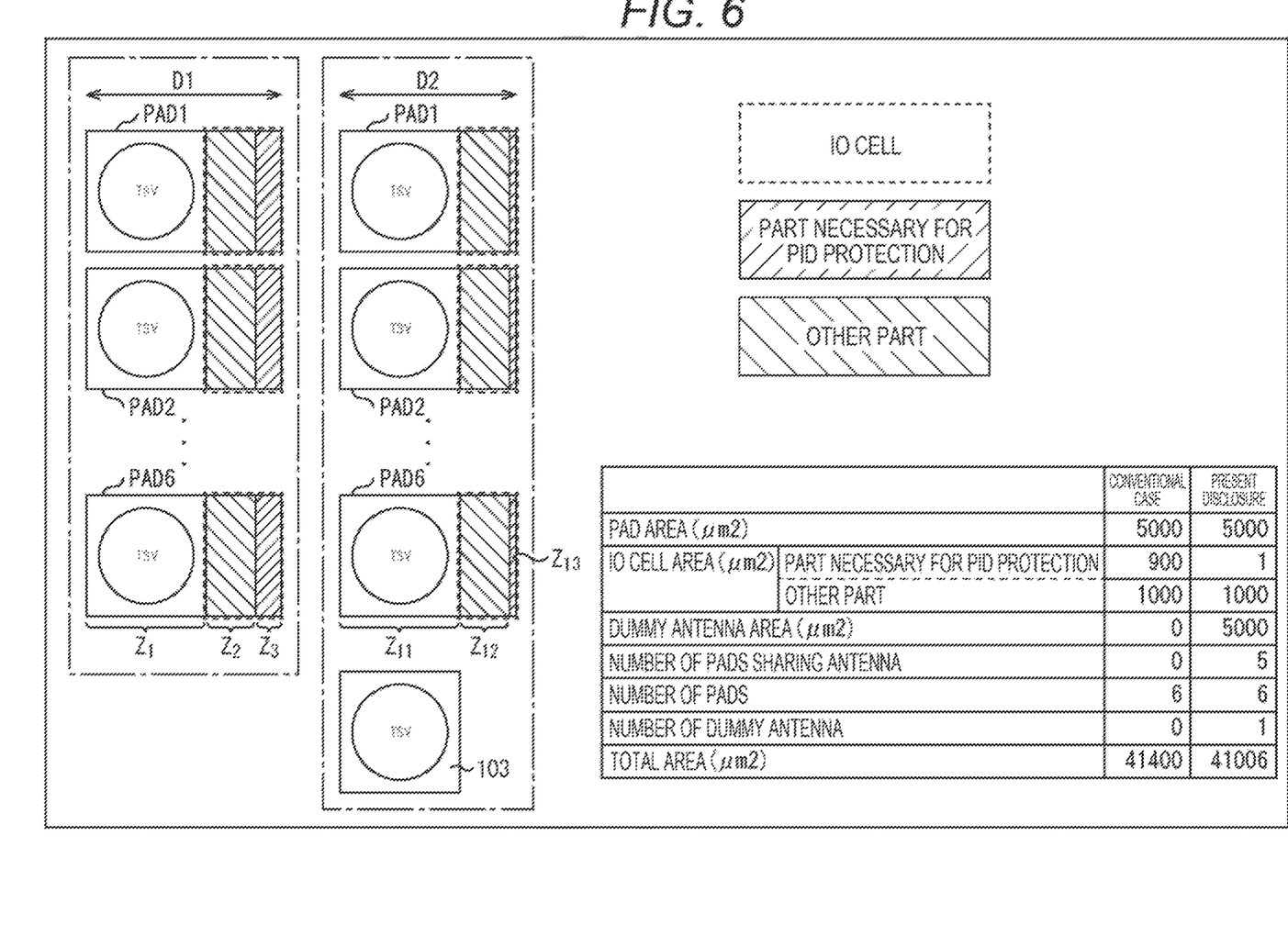
FIG. 6 is a diagram illustrating an exemplary configuration in a case where a dummy antenna is shared by a plurality of PADs.

For example, as illustrated in FIG. 6, in a case where the PID is set for the through silicon via (TSV), although the area of the dummy antenna is added to the area of the entire layout, area of a protective circuit per TSV is smaller than that in the case of using the conventional protective diode. Therefore, in this case, one dummy antenna 103 is shared by six protection MOSFETs 104, for example, whereby the entire area can be reduced.

In the left part of FIG. 6, exemplary constituents in the layout of the conventional semiconductor device 11 and the semiconductor device 100 according to the present disclosure are illustrated. Pads PAD1 to PAD6 are illustrated from above for each device, and the dummy antenna 103 is further illustrated for the semiconductor device 100. Furthermore, in the right part of FIG. 6, breakdowns of the constituent areas of the conventional semiconductor device 11 and the semiconductor device 100 according to the present disclosure are illustrated.

As illustrated in the left part of FIG. 6, the conventional pads PAD1 to PAD6 having a width D1 in the horizontal direction are illustrated for the semiconductor device 11, and the pads PAD1 to PAD6 having a width D2 in the horizontal direction, and the dummy antenna 103 are illustrated for the semiconductor device 100 according to the present disclosure.

Each of the pads PAD1 to PAD6 of the semiconductor device 11 includes, from the left, a region Z1 provided with the TSV, a region Z2 of another part, and a region Z3 of a part necessary for protecting the PID, which are provided within the width D1. Here, the region Z2 of the other part and the region Z3 of the part necessary for protecting the PID, which are surrounded by the dotted line, are included in an input/output (IO) cell provided with an input/output circuit.

Meanwhile, in the semiconductor device 100 according to the present disclosure, a region Z11 provided with the TSV, a region Z12 of another part, and a region Z13 of a part necessary for protecting the PID are included, which are provided within the width D2 smaller than the width D1. Here, in a similar manner to the conventional semiconductor device 11, the region Z12 of the other part and the region Z13 of the part necessary for protecting the PID, which are surrounded by the dotted line, are included in an input/output (IO) cell provided with an input/output circuit. Furthermore, the sizes of the pads PAD1 to PAD6 in the height direction in the drawing are the same for both of the semiconductor devices 11 and 100.

In other words, in the semiconductor device 100 according to the present disclosure, since no diode is used for protecting the PID, the region Z13 of the part necessary for protecting the PID is smaller than the region Z3 of the part necessary for protecting the PID. Accordingly, the width D2 is smaller than the width D1, and it can be made smaller as a whole.

Meanwhile, the semiconductor device 100 according to the present disclosure further includes the dummy antenna 103.

However, as illustrated in the right part of FIG. 6, the area of each pad is set to a PAD area=5,000 um², the area of the IO cell necessary for the PID is set to 900 um² for the cell having the width D1 on the left side in the drawing, 1 um² for the cell having the width D2, and 1,000 um² for the other area, and the area of the dummy antenna is set to 5,000 um².

In such a case, if the dummy antenna is shared by the six pads PAD1 to PAD6, the required area is substantially matched in any pad having the width D2 or D1. That is, in the right part of FIG. 6, while the area of the conventional semiconductor device 11 is 41,400 um², the area of the semiconductor device 100 according to the present disclosure is 41,006 um².

A pitch of the wiring serving as the dummy antenna 103 is made smaller than a pitch of the wiring connected to the MOSFET to be protected 102, or a diameter of the via is made smaller than that of the via connected to the MOSFET to be protected 102 relative to the wiring or the via included in the antenna 101 connected to the MOSFET to be protected 102, which serves as a PID factor, whereby the electron shading effect can be enhanced, positive charges can be easily collected in the gate of the protection MOSFET 104, and the protection function can be further enhanced.

<PID Protecting Operation of Semiconductor Device of Present Disclosure>

Next, PID protecting operation of the semiconductor device according to the present disclosure will be described with reference to the flowchart in FIG. 7.

In step S31, when the plasma process is started, a plasma charge is generated.

In step S32, due to the plasma charge of the dummy antenna 103, a gate voltage of the protection MOSFET 104 increases by a voltage corresponding to the number of stages of the gate bias setting diode 105 (105-1 and 105-2 in FIG. 4) (=Vf×n (Vf: voltage per stage of the gate bias setting diode 105, n: the number of stages)).

In step S33, the protection MOSFET 104 is turned on.

In step S34, charges based on the plasma charge of the antenna 101 including the wiring and the via at the gate of the MOSFET to be protected 102 are released to the ground as the ON current of the protection MOSFET 104. In other words, since the protection MOSFET 104 is turned on, the drain and the source of the protection MOSFET 104 are brought into a conductive state, whereby the charges of the gate of the MOSFET to be protected 102 connected to the drain are released to the ground.

In this manner, when the plasma process is started, operations of steps S31 to S34 are performed, and the MOSFET to be protected 102 continues to be protected from the PID.

In step S35, when the plasma process is terminated, the plasma charge in the dummy antenna 103 disappears.

In step S36, the charge of the gate of the protection MOSFET 104 is released to the ground via the gate bias setting diode 105, and the gate voltage of the protection MOSFET 104 is turned to zero.

In other words, when the plasma process is terminated, the gate bias setting diode 105 is connected to the gate of the protection MOSFET 104, whereby the charge of the gate of the protection MOSFET 104 is released to the ground via the gate bias setting diode 105. At this time, the potential of the gate bias setting diode 105 is set to be equal to or higher than the threshold value Vth of the protection MOSFET 104, whereby the gate voltage of the protection MOSFET 104 can be reliably set to zero.

In step S37, the protection MOSFET 104 is turned off.

According to this process, the MOSFET to be protected 102 can be reliably operated thereafter.

With the operation described above, a large PID charge is released highly efficiently without increasing the chip area, whereby the element to be protected can be protected from the PID with higher accuracy.

Note that the processing described above is based on the configuration in which the pitch of the wiring serving as the dummy antenna 103 is made smaller than the pitch of the wiring connected to the MOSFET to be protected 102, or the diameter of the via is made smaller than that of the via connected to the MOSFET to be protected 102 so that the electron shading effect can be enhanced and the positive charges can be easily collected in the gate of the protection MOSFET 104.

Figure 7:
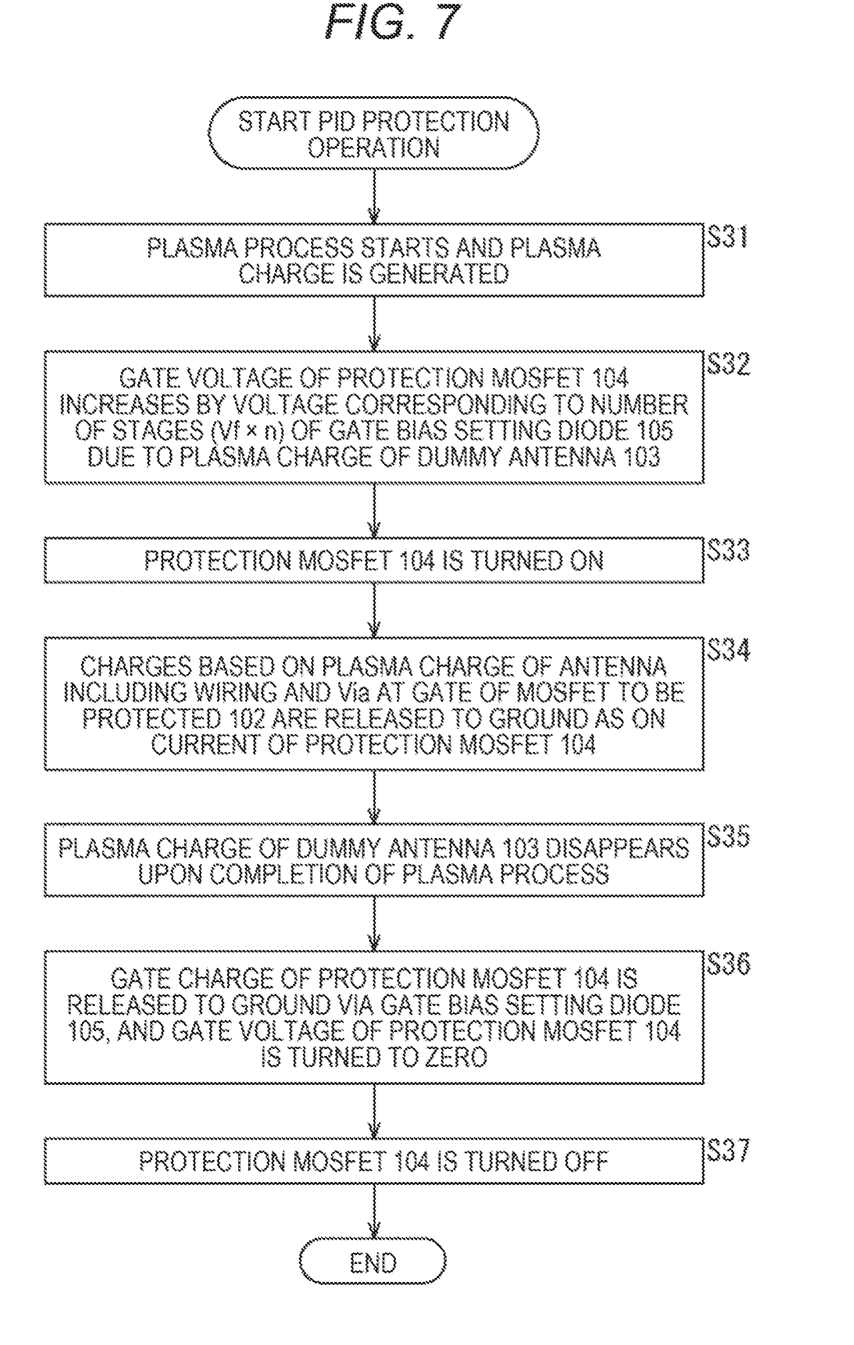
FIG. 7 is a flowchart illustrating protecting operation of the semiconductor device in FIG. 4.

In other words, according to such a configuration, as illustrated in the flowchart of FIG. 7, in a case where the plasma charge is generated, the gate voltage of the protection MOSFET 104 is increased by the dummy antenna 103, and the protection MOSFET 104 is reliably turned on at a timing earlier than the time at which the threshold value Vth of the MOSFET to be protected 102 is exceeded due to the antenna 101.

As a result, the protection MOSFET 104 can be turned on before the MOSFET to be protected 102 is turned on by the plasma charge, whereby the MOSFET to be protected 102 can be reliably protected from the PID.

<Method of Manufacture>

Next, a method for manufacturing the semiconductor device according to the present disclosure will be described with reference to FIG. 8.

Figure 8:
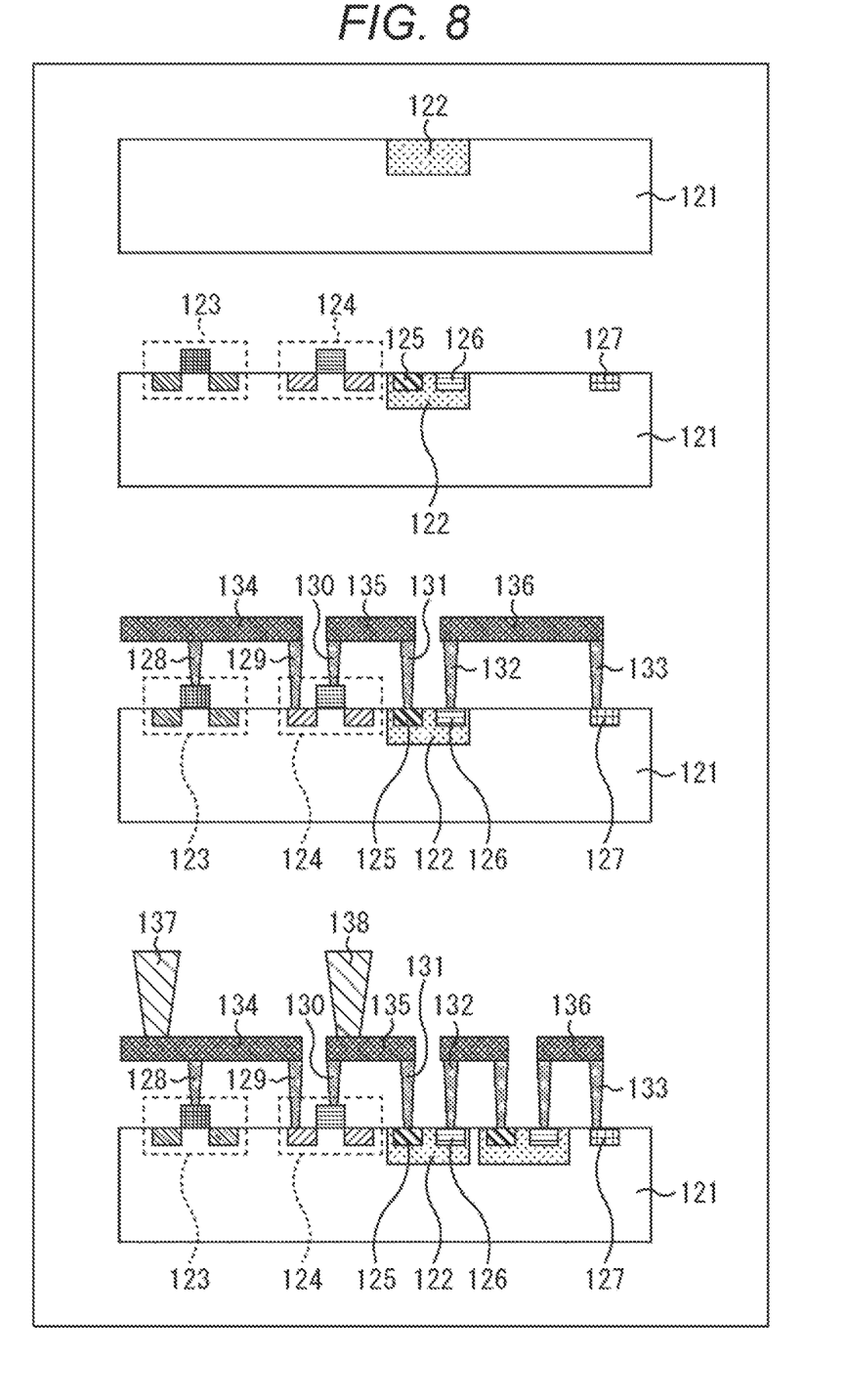
FIG. 8 is a diagram illustrating a method for manufacturing the semiconductor device in FIG. 4.

In a first step, as illustrated in the uppermost stage of FIG. 8, a diffusion layer 122 to be a part of the gate bias setting diode 105 is formed on an Si substrate 121.

In a second step, as illustrated in the second stage from the top in FIG. 8, using a technique of patterning based on a deposition of a gate electrode material, subsequent photolithography, and etching, for example, a gate electrode of a MOSFET 123 to be an element to be protected is formed using a method of ion injection or the like, and a diffusion layer of a source drain is formed, thereby forming the MOSFET to be protected 123. This MOSFET to be protected 123 corresponds to the MOSFET to be protected 102 in FIG. 4.

In a third step, a gate electrode and a source drain of a protection MOSFET 124 are formed in a similar manner. This protection MOSFET 124 corresponds to the protection MOSFET 104 in FIG. 4.

In a fourth step, a diffusion layer 125 and a diffusion layer 126 are formed on the diffusion layer 122 using the method of ion injection or the like, thereby forming the gate bias setting diode 105-1.

In a fifth step, a contact diffusion layer 127 with respect to the substrate 121 is formed.

In a sixth step, as illustrated in the third stage from the top in FIG. 8, contact holes (vias) 128 and 129 are opened on the terminal to be protected (gate is illustrated in the drawing) of the MOSFET 123 corresponding to the MOSFET to be protected 102 and on the drain terminal of the MOSFET 124 corresponding to the protection MOSFET 104, and a wiring layer 134 is formed thereon and connected.

In a seventh step, contact holes (vias) 130 and 131 are formed and a wiring layer 135 is formed, which are connected to the target terminal of the protection MOSFET 102 and the diffusion layer 125 of the gate bias setting diode 105-1, respectively.

In an eighth step, the diffusion layer 126 to be a terminal of the gate bias setting diode 105-2 is connected to the substrate by a contact hole 132, a wiring layer 136, and a contact hole 133 being formed.

In a ninth step, an antenna (not an actual antenna, but functions as an antenna) 137 by which the wiring layer 134 connected to the gate electrode of the MOSFET 123 of the MOSFET to be protected 102 receives the plasma charge, which includes the wiring or the via connected to the terminal to be protected of the MOSFET of the MOSFET to be protected 102 is formed, and a dummy antenna 138 is formed on the wiring layer 135 connected to the gate electrode of the MOSFET 124 of the protection MOSFET 104. In other words, the dummy antenna 138 is formed simultaneously with the antenna 137 including the wiring or the via connected to the terminal to be protected of the MOSFET of the MOSFET to be protected 102.

As described above, with the semiconductor device according to the present disclosure, the large PID charge is released highly efficiency without increasing the chip area, whereby the MOSFET to be protected can be protected from the PID. Furthermore, the MOSFET to be protected can be reliably protected from a various levels of the PID without causing adverse effect such as an increase in leakage. Moreover, it is also possible to deal with the large PID that has already occurred such as a laminated chip structure and a CSP structure, whereby performance and a production yield of such a semiconductor device can be increased and the cost can be reduced as the chip area is reduced.

Note that, although the semiconductor device including both of the MOSFET to be protected and the protection MOSFET has been described as an example in the above descriptions, it is not necessary to mount the protection MOSFET in a final product. Accordingly, at the time when all manufacturing steps are complete, or in a manufacturing step with no subsequent plasma process, for example, the protection MOSFET may be omitted from the semiconductor device itself. In other words, in this case, the protection MOSFET functions only as a PID protection device of the MOSFET to be protected.

Furthermore, although the exemplary case where the protection element includes the MOSFET type element and is used as the protection MOSFET has been described in the descriptions above, the protection element is not necessarily the MOSFET type element as long as it has a similar function as the protection element. For example, the protection element may include a bipolar transistor. In a case where the protection element includes the bipolar transistor, the gate, source, and drain correspond to a base, emitter, and collector, respectively.

Note that the present disclosure can also employ the following configurations.

<1> A semiconductor device, including:
a protection metal-oxide-semiconductor field-effect transistor (MOSFET) that includes a drain connected to a gate electrode of a MOSFET to be protected and a grounded source and protects the MOSFET to be protected from a plasma-induced damage (PID); and
a dummy antenna connected to a gate electrode of the protection MOSFET, the dummy antenna turning on the protection MOSFET before charge accumulates in the gate electrode of the MOSFET to be protected due to PID charge.

<2> The semiconductor device according to <1>, in which a via included in the dummy antenna has a diameter smaller than a diameter of a via connected to the MOSFET to be protected.

<3> The semiconductor device according to <1> or <2>, in which wiring included in the dummy antenna is wiring having a pitch smaller than a pitch of wiring connected to the MOSFET to be protected.

<4> The semiconductor device according to any one of <1> to <3>, further including:
a potential switching unit in which potential of the gate electrode of the protection MOSFET becomes ground potential in a case where the PID charge is not generated.

<5> The semiconductor device according to <4>, in which the potential switching unit is a diode provided between the gate electrode and a substrate, the diode in which a forward direction is directed to the substrate.

<6> The semiconductor device according to <4>, in which the potential switching unit is a resistor provided between the gate electrode and the substrate.

<7> The semiconductor device according to <4>, in which the potential switching unit is a MOSFET provided between the gate electrode and the substrate.

<8> A method for manufacturing a semiconductor device, the device including:
a protection metal-oxide-semiconductor field-effect transistor (MOSFET) that includes a drain connected to a gate electrode of a MOSFET to be protected and a grounded source and protects the MOSFET to be protected from a plasma-induced damage (PID); and
a dummy antenna connected to a gate electrode of the protection MOSFET, the dummy antenna turning on the protection MOSFET before charge accumulates in the gate electrode of the MOSFET to be protected due to PID charge, the method including:
a step of forming the MOSFET to be protected;
a step of forming the protection MOSFET;
a step of forming wiring between the gate electrode of the MOSFET to be protected and the drain of the protection MOSFET;
a step of forming wiring and a via in the MOSFET to be protected; and
a step of forming the dummy antenna on the protection MOSFET.

<9> The method for manufacturing a semiconductor device according to <8>, further including:
a step of forming a gate protective diode.

<10> A plasma-induced damage (PID) protection device, including:
a protection metal-oxide-semiconductor field-effect transistor (MOSFET) that includes a drain connected to a gate electrode of a MOSFET to be protected and a grounded source and protects the MOSFET to be protected from a PID; and
a dummy antenna connected to a gate electrode of the protection MOSFET, the dummy antenna turning on the protection MOSFET before charge accumulates in the gate electrode of the MOSFET to be protected due to PID charge.

<11> The PID protection device according to <10>, further including:
a potential switching unit that functions as a resistor when current flows from the gate electrode of the MOSFET to be protected to a substrate through a channel of the protection MOSFET, and becomes a ground potential when the current does not flow.

<12> The PID protection device according to <11>, in which the potential switching unit is a diode provided between the gate electrode and the substrate, the diode in which a forward direction is directed to the substrate.

<13> The PID protection device according to <11>, in which the potential switching unit is a resistor provided between the gate electrode and the substrate.

<14> The PID protection device according to <11>, in which the potential switching unit is a MOSFET provided between the gate electrode and the substrate.

<15> A plasma-induced damage (PID) protection device, including:

a bipolar transistor that includes a collector connected to a gate electrode of a metal-oxide-semiconductor field-effect transistor (MOSFET) to be protected and a grounded emitter and protects the MOSFET to be protected from a PID; and a dummy antenna connected to a base electrode of the bipolar transistor, the dummy antenna turning on the transistor before charge accumulates in the gate electrode of the MOSFET to be protected due to PID charge.

<16> The PID protection device according to <15>, further including:

a potential switching unit that functions as a resistor when current flows between the base electrode and the emitter, and becomes a ground potential when the current does not flow.

<17> The PID protection device according to <16>, in which the potential switching unit is a diode provided between the base electrode and the emitter, the diode in which a forward direction is directed to the emitter.

<18> The PID protection device according to <16>, in which the potential switching unit is a resistor provided between the base electrode and the emitter.

<19> The PID protection device according to <16>, in which the potential switching unit is a MOSFET provided between the base electrode and the emitter.

REFERENCE SIGNS LIST

100 Semiconductor device
101 Antenna
102 MOSFET to be protected
103 Antenna
104 Protection MOSFET
105, 105-1, 105-2 Gate bias setting diode

The invention claimed is:

1. A semiconductor device, comprising:
a protection metal-oxide-semiconductor field-effect transistor (MOSFET) that includes a drain connected to a gate electrode of a first MOSFET and a grounded source, wherein the protection MOSFET is configured to protect the first MOSFET from a plasma-induced damage (PID); and
a dummy antenna connected to a gate electrode of the protection MOSFET, wherein
the dummy antenna is configured to turn on the protection MOSFET before accumulation of charge in the gate electrode of the first MOSFET due to PID charge, and
the dummy antenna includes a via having a diameter smaller than a diameter of a via connected to the first MOSFET.

2. The semiconductor device according to claim 1, wherein
the dummy antenna includes wiring that has a pitch smaller than a pitch of wiring connected to the first MOSFET.

3. The semiconductor device according to claim 1, further comprising:
a potential switching unit configured to switch potential of the gate electrode of the protection MOSFET to ground potential based on in a case where the PID charge is not generated.

4. The semiconductor device according to claim 3, wherein
the potential switching unit is a diode between the gate electrode and a substrate, and
a forward direction of the diode is directed to the substrate.

5. The semiconductor device according to claim 3, wherein
the potential switching unit is a resistor between the gate electrode and a substrate.

6. The semiconductor device according to claim 3, wherein
the potential switching unit is a second MOSFET between the gate electrode and a substrate.

7. A plasma-induced damage (PID) protection device, comprising:
a protection metal-oxide-semiconductor field-effect transistor (MOSFET) that includes a drain connected to a gate electrode of a first MOSFET and a grounded source, wherein the protection MOSFET is configured to protect the MOSFET from a PID; and
a dummy antenna connected to a gate electrode of the protection MOSFET, wherein
the dummy antenna is configured to turn on the protection MOSFET before accumulation of charge in the gate electrode of the first MOSFET due to PID charge, and
the dummy antenna includes a via having a diameter smaller than a diameter of a via connected to the first MOSFET.

8. The PID protection device according to claim 7, further comprising:
a potential switching unit configured to:
function as a resistor based on a flow of current from the gate electrode of the first MOSFET to a substrate through a channel of the protection MOSFET; and
function as a ground potential when the current does not flow.

9. The PID protection device according to claim 8, wherein
the potential switching unit is a diode between the gate electrode and the substrate, and
a forward direction of the diode is directed to the substrate.

10. The PID protection device according to claim 8, wherein
the potential switching unit is the resistor between the gate electrode and the substrate.

11. The PID protection device according to claim 8, wherein
the potential switching unit is a second MOSFET between the gate electrode and the substrate.

* * * * *